United States Patent
Lim et al.

(10) Patent No.: US 7,652,906 B2
(45) Date of Patent: Jan. 26, 2010

(54) MEMORY DEVICE EMPLOYING MAGNETIC DOMAIN WALL MOVEMENT

(75) Inventors: Chee-kheng Lim, Yongin-si (KR); Eun-sik Kim, Yongin-si (KR); Sung-chul Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/851,049

(22) Filed: Sep. 6, 2007

(65) Prior Publication Data

US 2008/0068881 A1 Mar. 20, 2008

(30) Foreign Application Priority Data

Sep. 15, 2006 (KR) .................. 10-2006-0089651

(51) Int. Cl.
*G11C 19/00* (2006.01)
(52) U.S. Cl. .................. 365/81; 365/158; 365/171; 365/173; 977/933
(58) Field of Classification Search .................. 365/158, 365/189.011, 189.07, 148, 171, 173, 78, 365/80, 83, 85; 257/421, E21.665; 438/3; 977/933, 934, 935
See application file for complete search history.

(56) References Cited

U.S. PATENT DOCUMENTS

| 2004/0252539 | A1 | 12/2004 | Parkin |
| 2005/0078509 | A1* | 4/2005 | Parkin ................ 365/158 |
| 2005/0078511 | A1* | 4/2005 | Parkin ................ 365/171 |
| 2006/0120132 | A1 | 6/2006 | Parkin |

FOREIGN PATENT DOCUMENTS

JP 2006-005308 1/2006

OTHER PUBLICATIONS

European Search Report dated May 8, 2009.
Chinese Office Action and English translation dated Sep. 18, 2009.

* cited by examiner

*Primary Examiner*—Son Dinh
*Assistant Examiner*—Harry W Byrne
(74) *Attorney, Agent, or Firm*—Harness, Dickey & Pierce, P.L.C.

(57) ABSTRACT

Provided is a memory device employing magnetic domain wall movement. The memory device includes a first track, an interconnecting layer, and a second track. The first track including a magnetic material is formed in a first direction. The interconnecting layer is formed on the first track. The second track including a magnetic material is formed in a second direction on the interconnecting layer.

15 Claims, 8 Drawing Sheets

MEMORY DEVICE EMPLOYING MAGNETIC DOMAIN WALL MOVEMENT

CROSS-REFERENCE TO RELATED PATENT APPLICATION

This application claims the benefit of Korean Patent Application No. 10-2006-0089651, filed on Sep. 15, 2006, in the Korean Intellectual Property Office, the disclosure of which is incorporated herein in its entirety by reference.

BACKGROUND OF THE INVENTION

1. Field of the Invention

The present invention relates to a memory device, and more particularly, to a memory device for writing, storing, and deleting data by inducing magnetic domain wall movement.

2. Description of the Related Art

Due to developments in information technology leading to a requirement for high capacity data storage, demand for data storage media capable of storing large quantities of data continues to increase. Accordingly, data storage speed has been augmented, methods of compacting storage devices have been developed, and as a result, a wide variety of data storage devices has been developed. A widely-used data storage medium is a hard disk drive (HDD), which includes a read/write head and a rotating medium on which data is recorded, and has the capacity for recording 100 gigabytes (GB) of data or more. However, the rotating parts in storage devices such as HDDs have a tendency to wear, so that the reliability of such devices is compromised by the likelihood of a failure during operation after a prolonged period of use.

At present, research and development is underway on a new data storage device that uses a magnetic domain wall movement principle.

FIGS. 1A through 1C are perspective views illustrating a principle of moving a magnetic domain wall. Referring to FIG. 1A, a magnetic wire 10, which includes including a first magnetic domain 11, a second magnetic domain 12, and a magnetic domain wall 13 between the first and second magnetic domains 11 and 12, is illustrated.

A magnetic micro region within a magnetic material will hereinafter be referred to as a magnetic domain. In such a magnetic domain, the rotation of electrons, that is, the direction of the magnetic moment of the electrons is the same. The size and magnetization direction of such a magnetic domain can be adjusted by altering the type of magnetic material, its shape, and size, as well as applied external energy. A magnetic domain wall is a region which separates magnetic domains each having different magnetization directions. Such a magnetic domain wall may be moved or propagated by the application of a magnetic field or a current to a magnetic material.

As illustrated in FIG. 1A, after a plurality of magnetic domains disposed in predetermined directions are created in a magnetic layer with a predetermined width and thickness, the directions of magnetization of the magnetic domains may be reversed using magnetic fields or currents.

Referring to FIG. 1B, when a magnetic field is applied along the magnetic wire 10 in a direction from the second magnetic domain 12 to the first magnetic domain 11, the magnetic domain wall 13 may move in the same direction of the application of the external magnetic field, that is, in the direction from the second magnetic domain 12 toward the first magnetic domain 11. Using the same principle, when a magnetic field is applied in a direction from the first magnetic domain 11 to the second magnetic domain 12, the magnetic domain wall 13 moves in a direction from the first magnetic domain 11 to the second magnetic domain 12.

Referring to FIG. 1C, when an external current is supplied in the direction from the first magnetic domain 11 to the second magnetic domain 12, the magnetic domain wall 13 moves toward the first magnetic domain 11. When a current is supplied, electrons flow in the opposite direction to the direction of the current, and the magnetic domain wall moves in the same direction as the electrons. That is, the magnetic domain wall moves in the direction opposite to that of the externally supplied current. When a current is supplied in a direction from the second magnetic domain 12 to the first magnetic domain 11, the magnetic domain wall moves toward the second magnetic domain 12.

In summary, a magnetic domain wall can be moved using an applied external magnetic field or current, which facilitates the propagation of a magnetic domain.

The principle of moving magnetic domains may be applied to a memory device such as an HDD or a read only memory (RAM). Specifically, it is possible to perform an operation for reading/writing binary data of '0' and '1' by using the principle of changing the magnetic arrangement within a magnetic material by moving a magnetic domain wall of the magnetic material having magnetic domains magnetized in predetermined directions, wherein the magnetic domain walls represents the boundaries between each of the magnetic domains. When a current is applied to a linear magnetic material, the positions of the magnetic domain walls are changed (i.e., the magnetic domain walls propagate) to read and write data, rendering the fabrication of a highly integrated device with a simple structure. Therefore, the principle of moving a magnetic domain wall can be used to fabricate and use memory devices with much larger storage capacities than the conventional memories, such as ferroelectric random access memory (FRAM), magnetoresistive random access memory (MRAM), and phase-change random access memory (PRAM) devices. However, the application of the moving of magnetic domain walls to semiconductor devices is still in the early development stage, and the devices have a comparatively low data storage density. Therefore, there is a need for memory devices employing magnetic domain wall movement with structures optimized for high-density devices.

SUMMARY OF THE INVENTION

The present invention provides a memory device having a low data storage density and a simple structure, employing magnetic domain wall movement.

According to an aspect of the present invention, there is provided a memory device, the memory device including: a first track layer formed in a first direction and including a magnetic material; an interconnecting layer formed on the first track layer; and a second track formed in a second direction on the interconnecting layer and including a magnetic material, wherein the first track layer and the second track layer each have a part extending from the interconnecting layer, the part being not in contact with the interconnecting layer, wherein the interconnecting layer is formed of a magnetic material which has a lower magnetic anisotropy energy constant than that of the first track layer and that of the second track layer, and wherein a magnetization direction of at least part of the first track, the second track and/or the interconnecting layer is reoriented.

The memory device may have a configuration or arrangement that the part of the first track layer, which is not in contact with the interconnecting layer and the part of the second track, which is not in contact with the interconnecting layer are parallel to each other, are orthogonal to each other, or are disposed to cross each other.

The first and second tracks each may be formed to have a multilayer structure.

The first and second tracks may be formed of a magnetic material having a magnetic anisotropy constant of between $10^5$ J/m$^3$ and $10^7$ J/m$^3$.

The first and second tracks may be formed of a material with a perpendicular magnetic anisotropy.

The first and second tracks may be formed of a material including at least one of CoPt and FePt.

The first and second tracks each may have a thickness in the range of 1 nm to 100 nm.

The interconnecting layer may have a multilayer structure.

The interconnecting layer may be formed of a magnetic material having a magnetic anisotropy constant between $10^2$ and $10^3$ J/m$^3$.

The interconnecting layer may have a thickness in the range of 10 nm to 100 nm.

The interconnecting layer may be formed of at least one of NiFe, CoFe, Ni, Fe, Co, and an alloy including at least one thereof.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
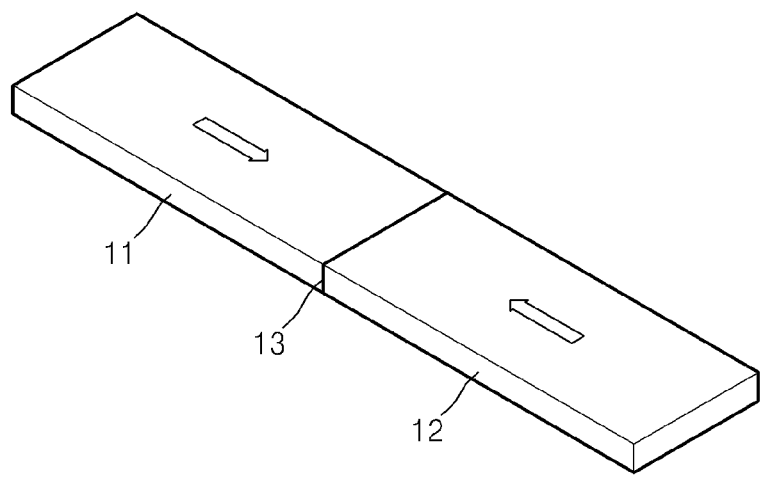
FIGS. 1A through 1C are perspective views illustrating the principles of magnetic domain wall movement.
Figure 1B:
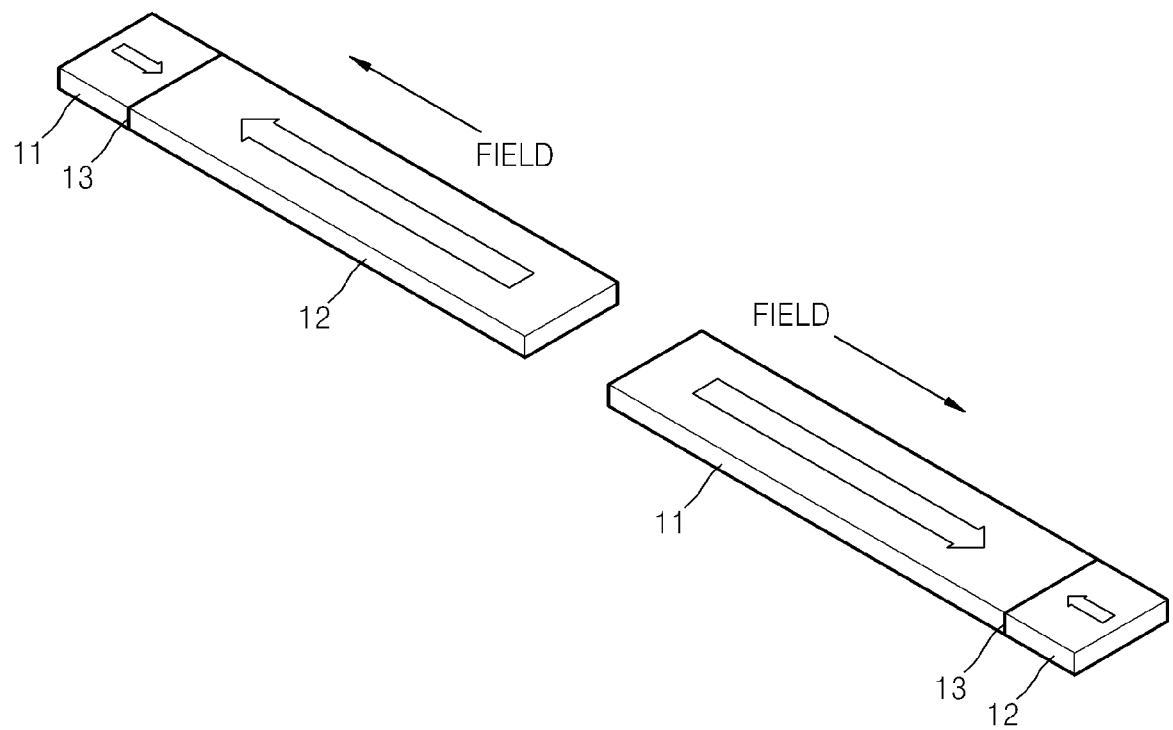
Figure 1C:
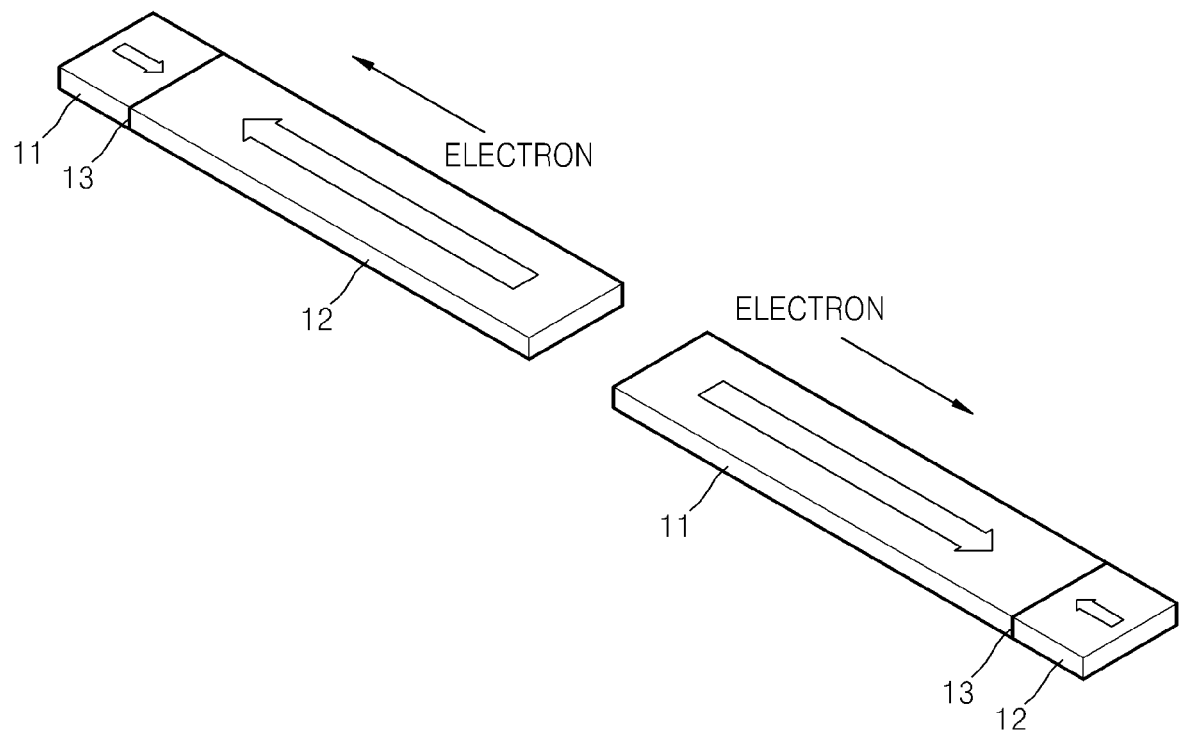

The present invention will now be described more fully with reference to the accompanying drawings according to embodiments of the present invention. In the drawings, the thicknesses of layers and regions are exaggerated for clarity.

The present invention provides a memory device including a first layer provided with a first track having at least one magnetic domain, a second layer provided with a second track formed of a magnetic material, and an interconnecting layer formed between the first and second layers. The first layer provided with a first track is also sometimes indicated as a "first track" throughout the specification. The second layer provided with a second track is also sometimes indicated as a "second track" throughout the specification.

Figure 2:
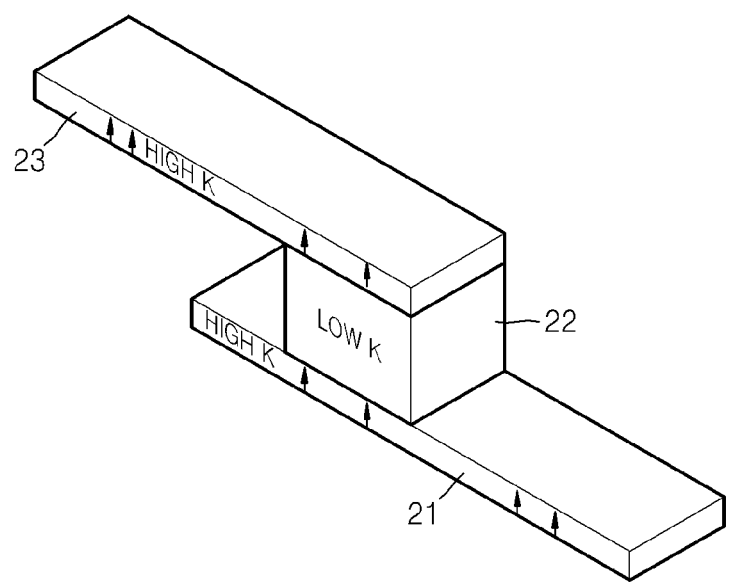
FIG. 2 is a perspective view illustrating a memory device employing magnetic domain wall movement according to an embodiment of the present invention.

FIG. 2 is a perspective view illustrating a memory device employing magnetic domain wall movement according to an embodiment of the present invention.

Referring to FIG. 2, the illustrated memory device includes a first track 21 formed in a first direction, a second track 23 formed in a second direction, and a soft magnetic interconnecting layer 22 formed between the first and second tracks 21 and 23. In an embodiment illustrated in FIG. 2, the first and second tracks 21 and 23 are formed parallel to each other, which can be defined as a parallel type memory device. The first track 21 functions as a writing track and the second track 23 functions as a data storage track.

The first and second tracks 21 and 23 are each formed of a material with high magnetic anisotropy characteristics to achieve increased data recording density. A material having a magnetic anisotropy constant of $10^5$ J/m$^3$ or more may be used. In one embodiment, a high Ku material having a magnetic anisotropy constant of $10^5$ J/m$^3$ to $10^7$ J/m$^3$ may be used. Specific examples of such materials are CoPt, FePt, and alloys thereof, which have perpendicular magnetization characteristics. The first and second tracks 21 and 23 may be formed in a single layer or multilayer structure. The first track and second track may be in the form of a wire or stripe. The thickness of the first and second tracks 21 and 23 may be 1 nm to 100 nm. The width of the first and second tracks 21 and 23 may range from 10 nm to 500 nm.

The interconnecting layer 22 is formed of a low Ku material with a magnetic anisotropy characteristic that is lower than those of the first and second tracks 21 and 23. The interconnecting layer 22 may be formed of a material with a magnetic anisotropy constant lower than $10^3$ J/m$^3$. In one embodiment, it may be formed of a material having a magnetic anisotropy constant of between $10^{2\ J/m^3}$ and $10^3$ J/m$^3$.

Specific examples of such materials are NiFe, CoFe, Ni, Fe, Co, and alloys including at least one material thereof. The thickness of the interconnecting layer 22 may be 10 nm or more. In one embodiment, it may be formed to between 10 nm and 100 nm.

Figure 3:
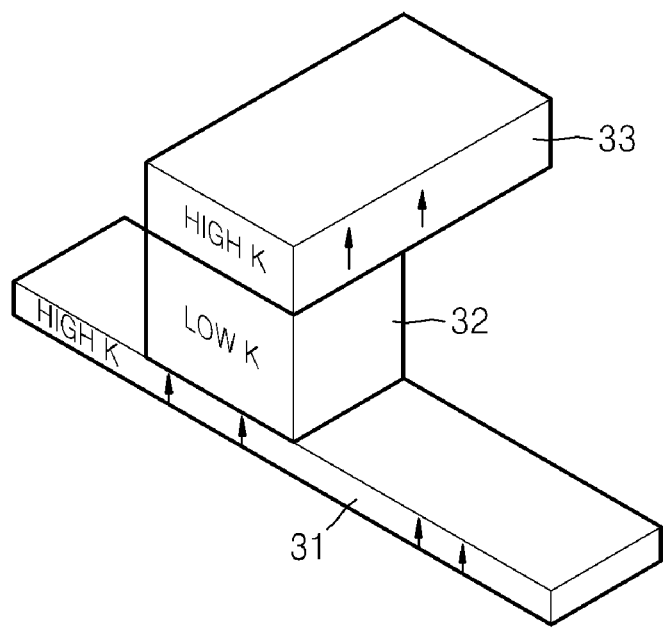
FIG. 3 is a perspective view illustrating a memory device employing magnetic domain wall movement according to another embodiment of the present invention.

FIG. 3 is a perspective view illustrating a memory device employing magnetic domain wall movement according to another embodiment of the present invention.

Referring to FIG. 3, the memory device includes a first track 31 formed in a first direction, a second track 33 formed in a second direction, and an interconnecting layer 32 formed between the first and second tracks 31 and 33. In the embodiment illustrated in FIG. 3, the first and second tracks 31 and 33 are formed orthogonal to each other, hereinafter this is referred to as an orthogonal type memory device.

For the memory device illustrated in FIG. 3, the configuration or arrangement of the second track 33 with respect to the first track 31 is different from that of the second track 23 illustrated in FIG. 2. However, the same material used for forming the embodiment illustrated in FIG. 2 can be used for the corresponding tracks and layers of the embodiment illustrated in FIG. 3.

Figure 4:
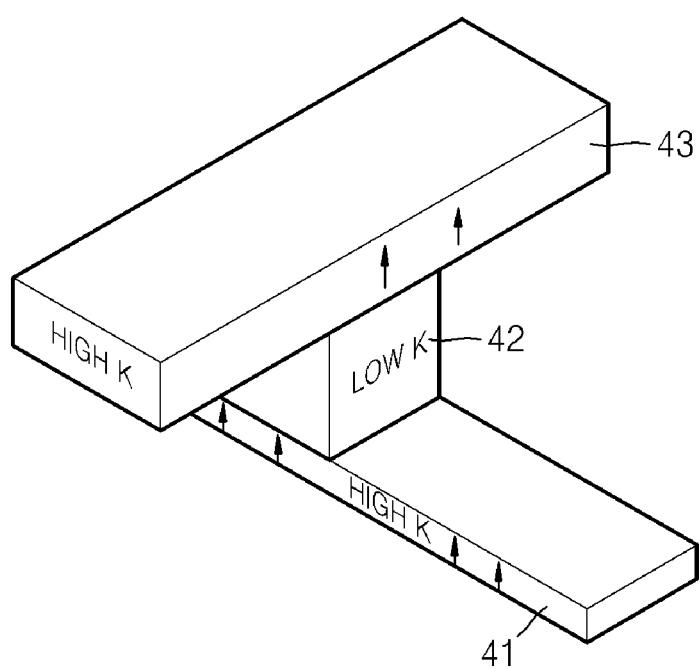
FIG. 4 is a perspective view illustrating a memory device employing magnetic domain wall movement according to another embodiment of the present invention.

FIG. 4 is a perspective view illustrating a memory device employing magnetic domain wall movement according to a third embodiment of the present invention.

Referring to FIG. 4, the memory device includes a first track 41 formed in a first direction, a second track 43 formed in a second direction, and an interconnecting layer 42 formed between the first and second tracks 41 and 43. In the embodiment illustrated in FIG. 4, the first and second tracks 41 and 43 are formed crossing each other, hereinafter this is referred to as a cross type memory device.

For the memory device illustrated in FIG. 4, compared with the memory device illustrated in FIG. 3, the second track 43 is formed to extend from both sides of the interconnecting layer 42.

FIGS. 2 through 4 are perspective views illustrating the memory device according to the forming directions of the first and second tracks. For the tracks of the memory device according to an embodiment of the present invention, the configuration or arrangement of the first and second tracks and the interconnecting layer may be adjusted according to the environment in which the device is used. The directions of the first and second tracks may be set as required. The first and second tracks may be formed of as wire or stripes which can have a large number of magnetic domains.

Figure 5A:
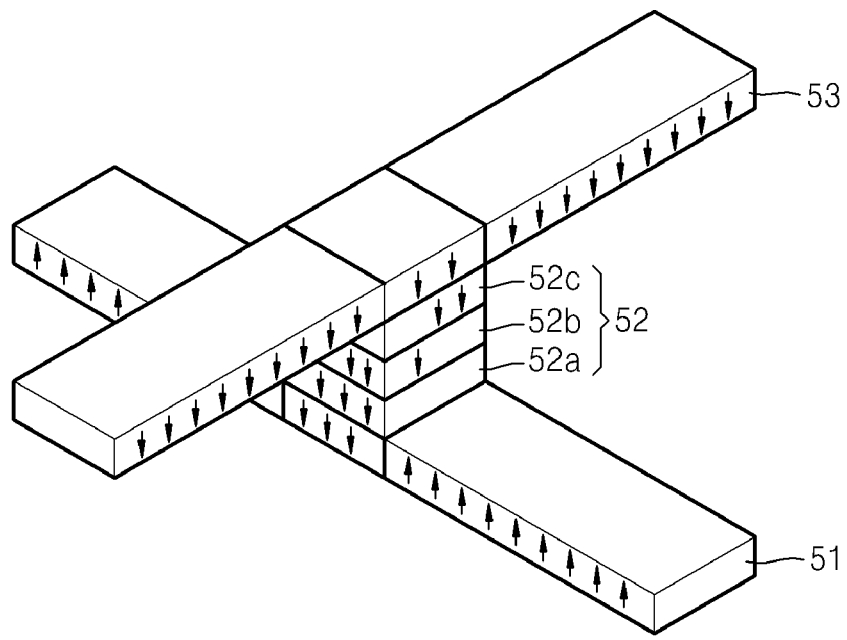
FIGS. 5A and 5B are perspective views illustrating a memory device employing magnetic domain wall movement according to another embodiment of the present invention, and more particularly, that can reorientate the magnetization direction of a soft magnetic interconnecting layer according to a magnetization direction of a writing track.
Figure 5B:
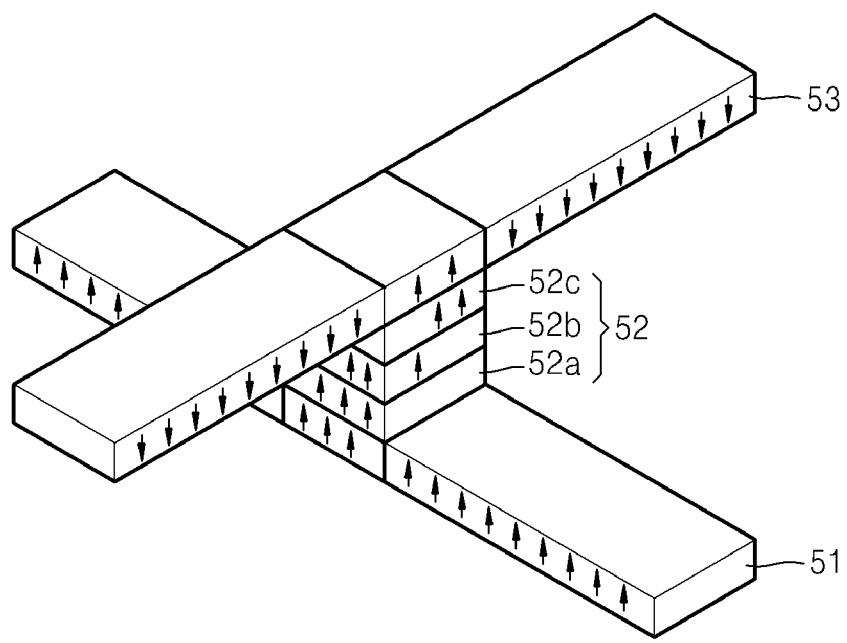

FIGS. 5A and 5B are perspective views illustrating a memory device employing magnetic domain wall movement according to another embodiment of the present invention. The interconnecting multilayer 52 is a multilayer which includes layers 52a, 52b, and 52c. The interconnecting multiplayer 52 is formed on a first track 51. A second track 53 is formed in a second direction on the interconnecting multilayer 52. The same materials as those used in the embodiment of the present invention illustrated in FIG. 2 may be used for the first and second tracks 51 and 53 and the interconnecting multilayer 52. As described above, the material of the interconnecting multilayer 52 can have a magnetic anisotropy energy constant of $10^3$ J/m$^3$ or less. A material having a magnetic anisotropy energy constant of $10^2$ J/m$^3$ to $10^3$ J/m$^3$ may be used. For example, NiFe, CoFe, Ni, Fe, Co, or material including at least one of NiFe, CoFe, Ni, Fe, and Co may be used.

FIGS. 5A and 5B show magnetization reversion of the interconnecting layer 52 and the second track 53. Referring to FIG. 5A, a magnetic domain of the second track 53 is moved to the first track 51 via the interconnecting multilayer 52. A current is supplied from the first track 51 to the second track 53. Referring to FIG. 5B, the magnetic domain of the first track 51 is moved to the second track 53 via the interconnecting multilayer 52. A current is supplied from the second track 53 to the first track 51.

FIGS. 6A through 6H are perspective views illustrating a data writing method of a memory device employing magnetic domain wall movement according to an embodiment of the present invention.

Figure 6A:
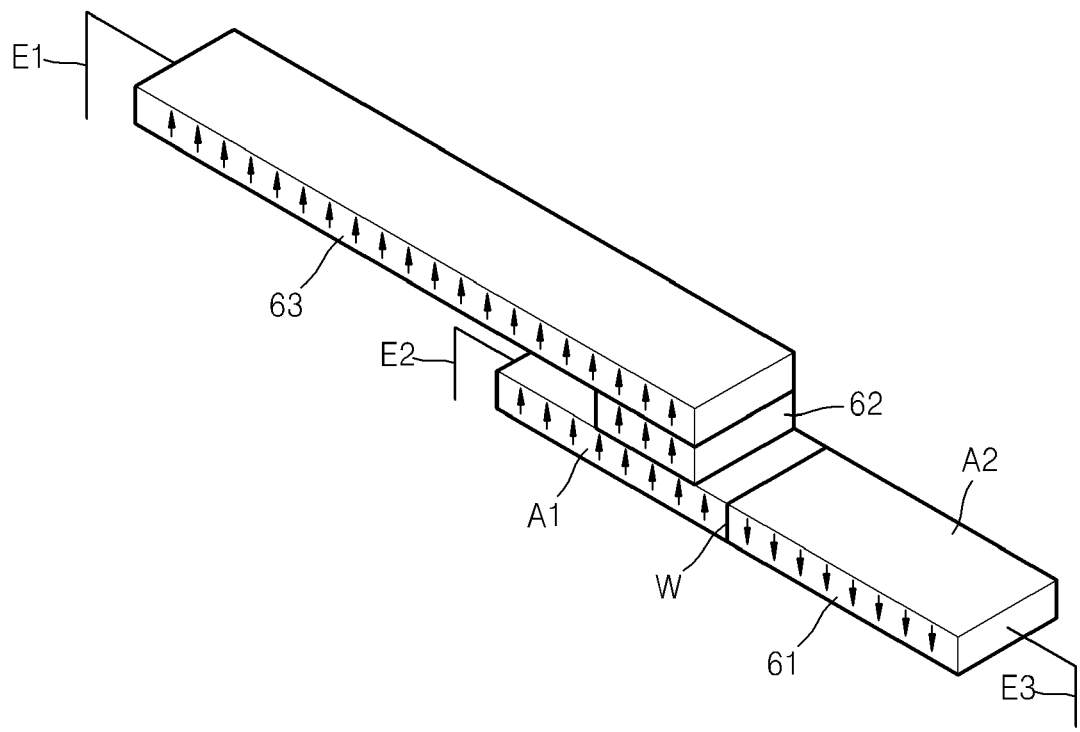
FIGS. 6A through 6H are perspective views illustrating a data writing method of a memory device employing magnetic domain wall movement according to an embodiment of the present invention.

Referring to FIG. 6A, a first track 61 is formed in parallel with a second track 63. An interconnecting layer 62 is formed between the first track 61 and the second track 63. Here, the first track 61 is a writing track and the second track 63 is a data storage track. A first conductive wire E1 formed of a conductive material is formed connected to a left end of the second track 63. A second conductive wire E2 is formed connected to a left end of the first track 61. A third conductive wire E3 is formed connected to a right end of the first track 61. A magnetic domain region A1 with an upward magnetization direction and a magnetic domain region A2 with a downward magnetization direction are formed on the first track 61. The magnetic domain region A1 is separated from the magnetic domain region A2 by a domain wall W. In the case of the second track 63, the magnetization is in an upward direction. Magnetization in a downward direction is set as "0", and magnetization in an upward direction is set as "1". A description of recording data as "0" on the second track 63 when the magnetization direction is initially in an upward direction will be described below.

Figure 6B:
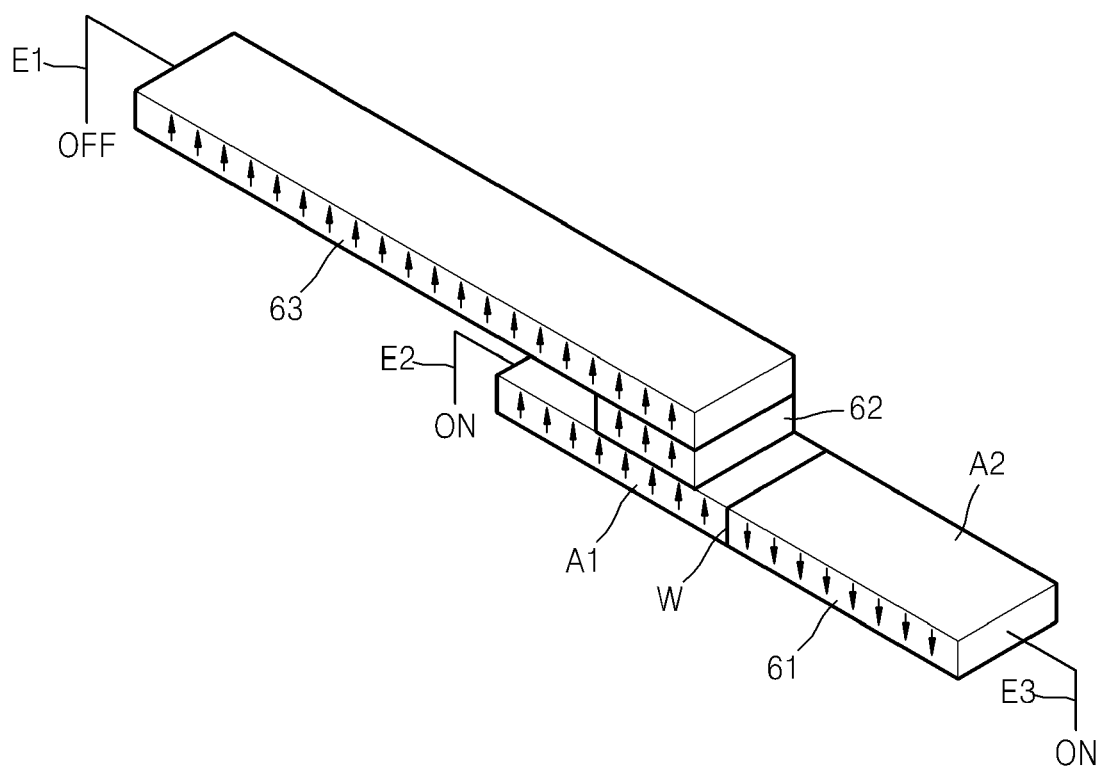

Referring to FIG. 6B, a current is supplied through the second and third conductive wires E2 and E3 on either end of the first track 61.

Figure 6C:
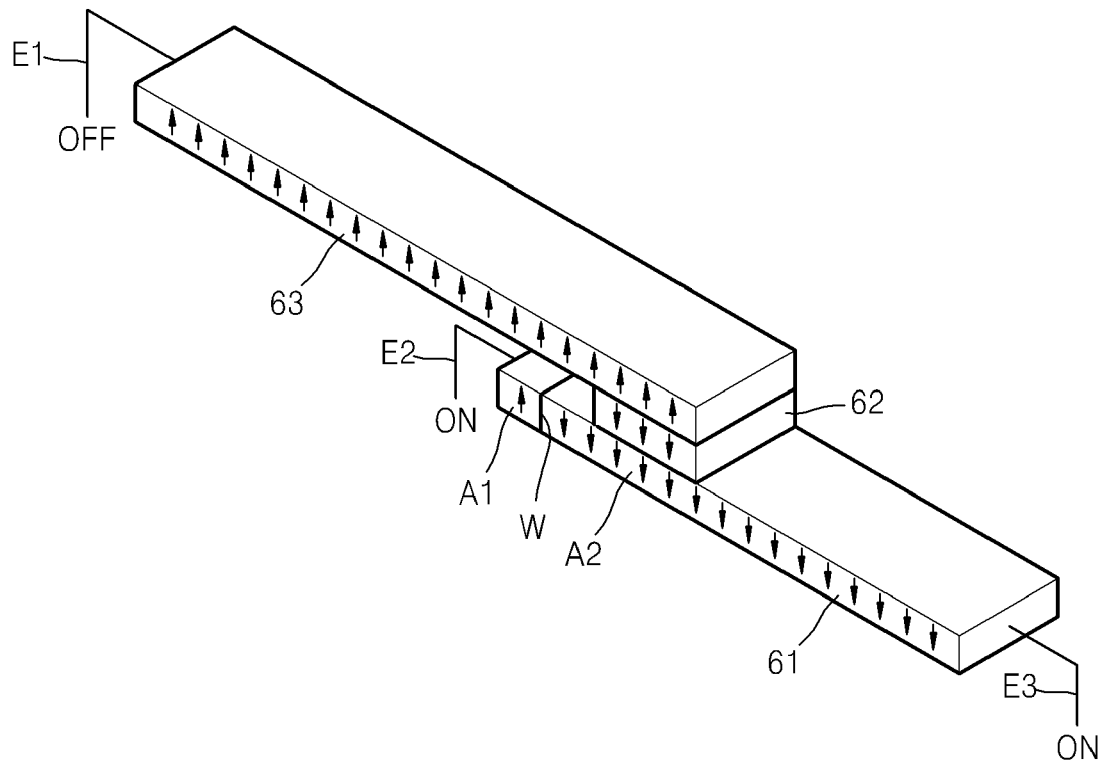

Referring to FIG. 6C, when a current is made to flow from the second conductive wire E2 towards the third conductive wire E3, a magnetic domain wall W moves in the direction opposite to the flow of current. The magnetic domain wall moves together with the movement of electrons, so that it moves in a direction opposite to the direction of the current. Accordingly, the magnetic domain wall W moves toward the second conductive wire E2. As a result, the length of the magnetic domain region A1 of the first track 61 is reduced, and the length of the magnetic domain region A2 is increased. When the magnetic domain A2 is positioned below the interconnecting layer 62, the interconnecting layer 62 is affected by the magnetic domain A2 and is magnetized in the same direction as the magnetic domain region A2. That is, a magnetic reversion occurs at the interconnecting layer 62.

Figure 6D:
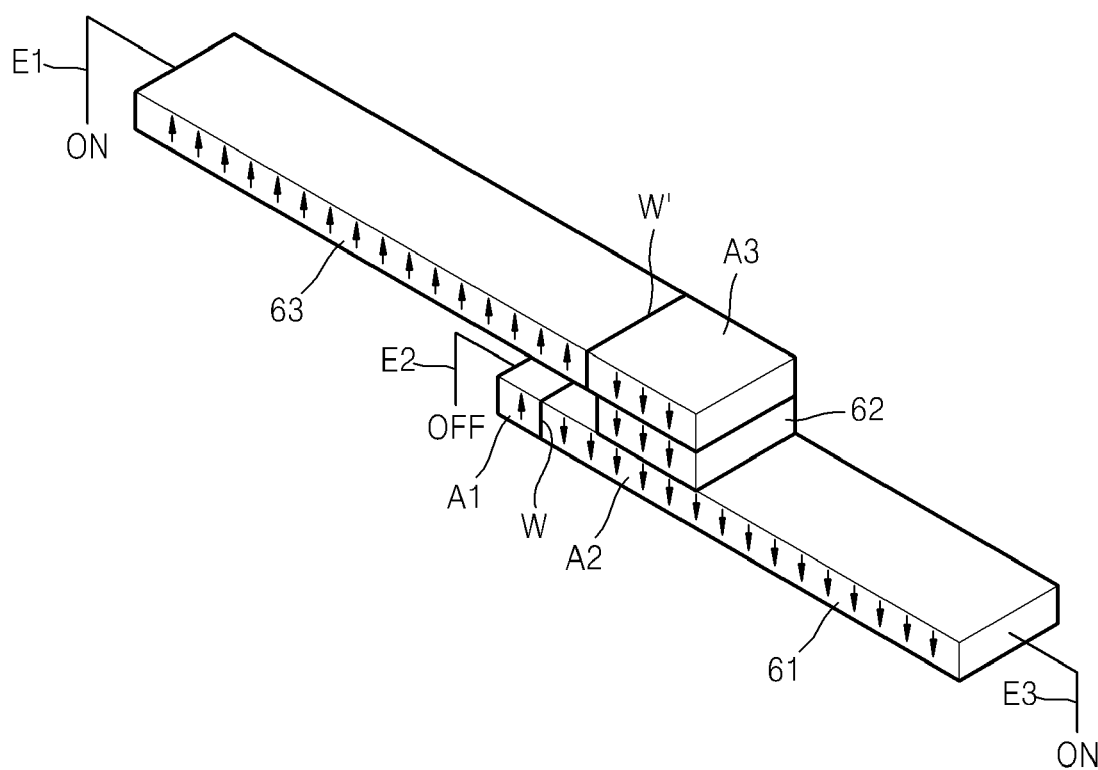

Referring to FIG. 6D, the second conductive wire E2 at the left end of the first track 61 is set in an OFF state, and the first conductive wire E1 on the left end of the second track 63 is set in an ON state. Also, a current is made to flow through the first and third conductive wires E1 and E3. The direction of current flow is set from the first conductive wire E1 to the third conductive wire E3, the magnetic domain A2 with a downward magnetization expands through the interconnecting layer 62 towards the second track 63, and the magnetization in the magnetic domain A3 of the second track 63 reverses from upward direction to downward direction, and as such data "0" is recorded on the second track 63. That magnetization reversion of the magnetic domain A3 of the second track 63 results in the injection of a domain wall W' in the second track 63.

Figure 6E:
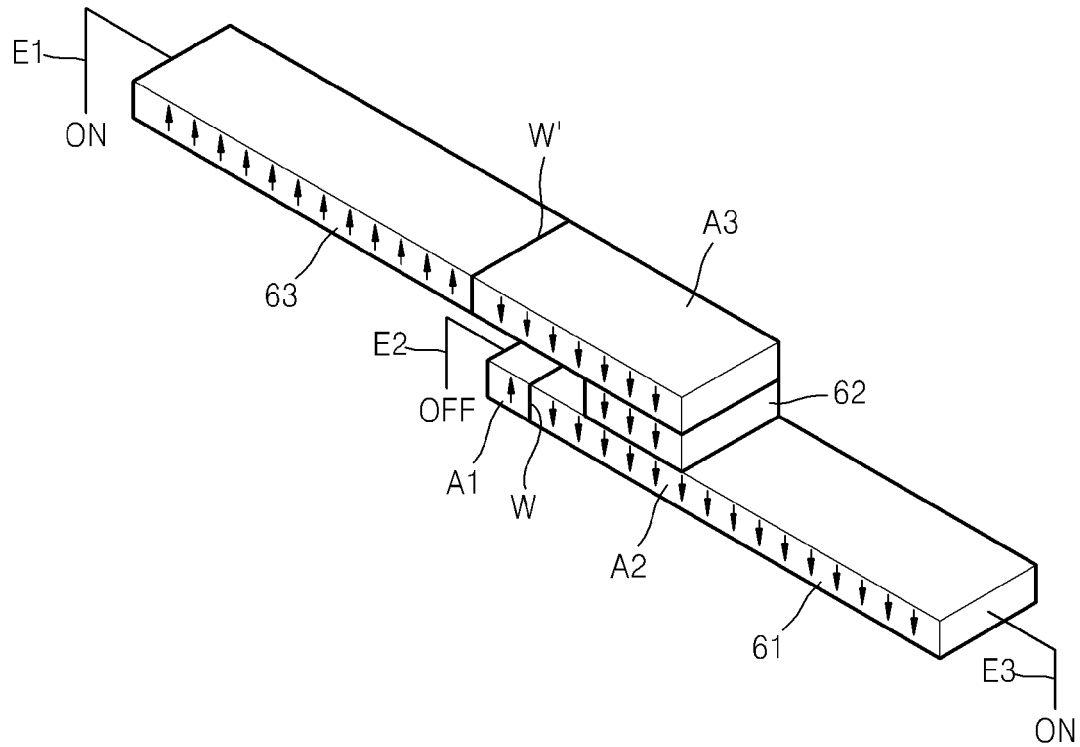

Referring to FIG. 6E, in order to move the magnetic domain wall W' toward the left end of the second track 63, electrons are made to flow from the third conductive wire E3 towards the first conductive wire E1, i.e. current is applied in the direction from the first conductive wire E1 to the third conductive wire E3.

Next, after the data "0" is recorded on the second track 63, a process of recording a magnetic domain region with an upward magnetization, that is, representing data "1" on the second track 63 will be described.

Figure 6F:
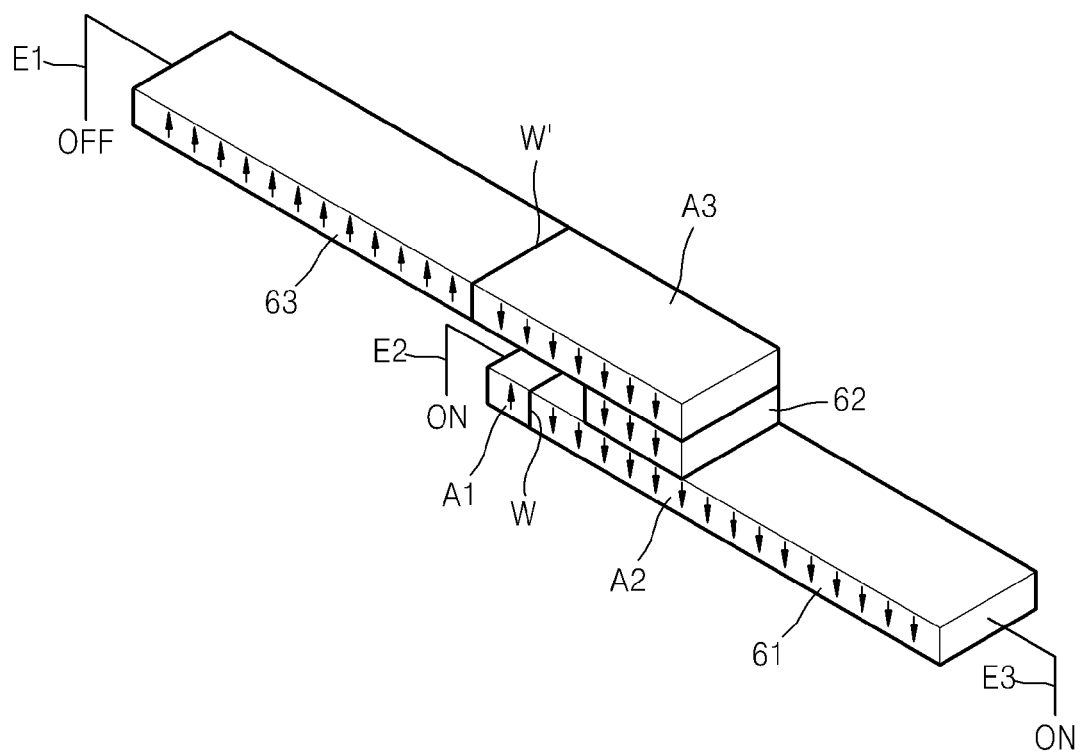

Referring to FIG. 6F, the first conductive wire E1 is set in an OFF state, and the second conductive wire E2 and the third conductive wire E3 are set in an ON state, and current is supplied.

Figure 6G:
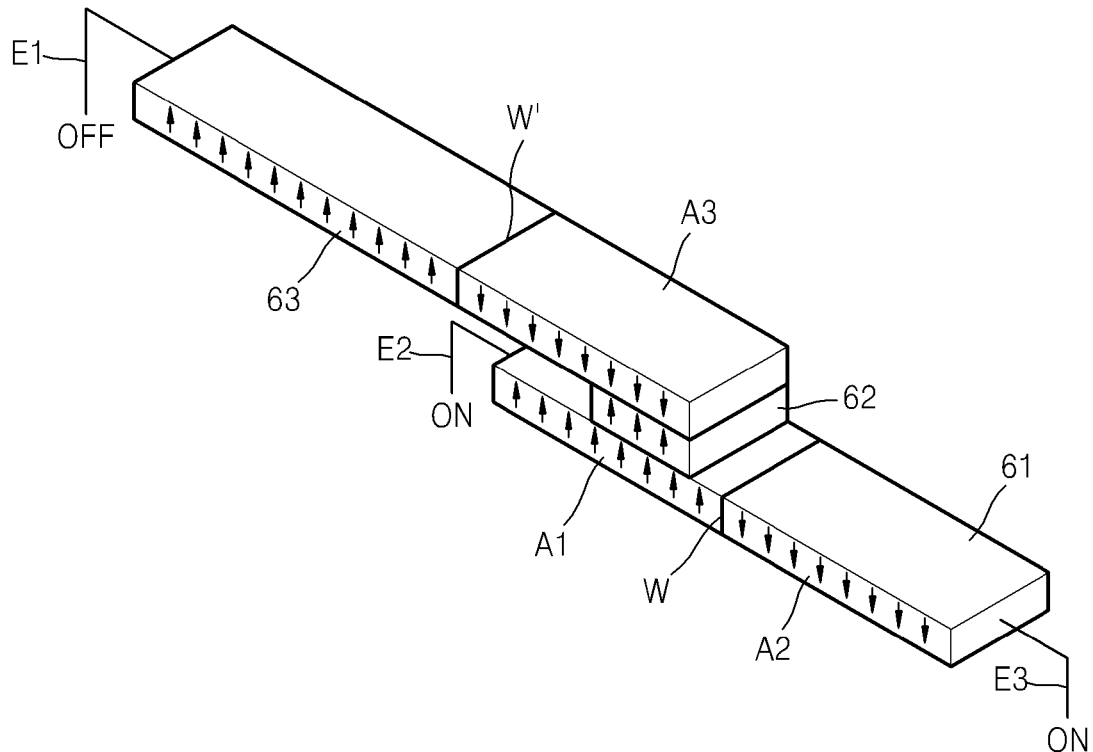

Referring to FIG. 6G, current is made to flow from the third conductive wire E3 toward the second conductive wire E2. When current flows from the third conductive wire E3 toward the second conductive wire E2, electrons move from the second conductive wire E2 towards the third conductive wire E3. Accordingly, the magnetic domain wall W that separates the magnetic domain A1 having an upward magnetization from the magnetic domain A2 having a downward magnetization moves in a direction to the right of the first track 61. Current is supplied until the magnetic domain wall W passes through a region of the first track 61, where the interconnecting layer 62 is in contact with the first track 61. The magnetic domain A1 contacts the interconnecting layer 62, so that the interconnecting layer 62 adopts a magnetization in the same upward direction as the magnetic domain A1 of the first track 61.

Figure 6H:
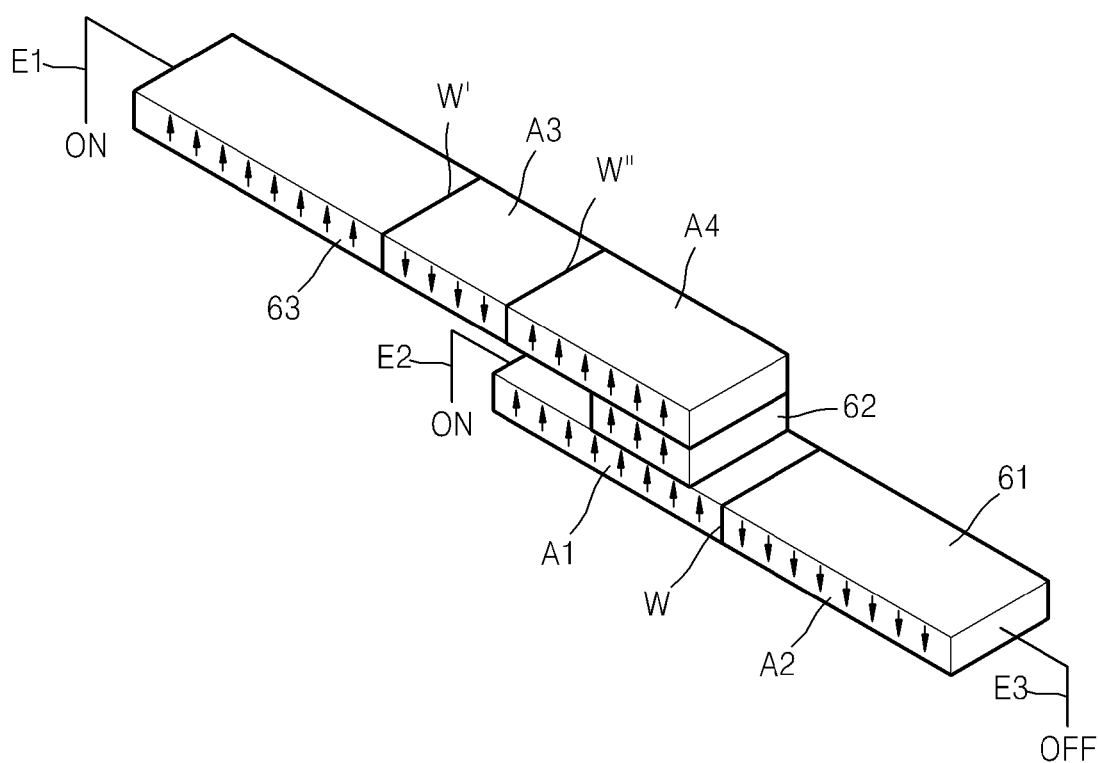

Referring to FIG. 6H, the first conductive wire E1 and the second conductive wire E2 are set in an ON state, and the third conductive wire E3 is set in an OFF state. When a current is supplied from the first conductive wire E1 towards the second conductive wire E2, electrons move from the second conductive wire E2 towards the first conductive wire E1. Accordingly, a region of the second track 3 which is in contact with the interconnecting layer 62 adopts the upward magnetization to form a magnetic domain A4. That results in the formation of a domain wall W″ between the domain A3 and the domain A4. When current supply continues, the domain wall W″ moves toward the electrode E1 along the second track 63. Thus, a data region "1" is created to the right of the data region "0".

The intensity and duration of a current or magnetic field to propagate magnetic domain walls or reverse magnetizations of magnetic domains in order to write and read data from the memory device according to the embodiments of the present invention may vary depending on the material, width and thickness of the layers, and may be determined by one skilled in the art.

In addition, a method of reading data in the memory device, as shown in FIGS. 6A-6H, according to an embodiment of the present invention is described below. A magnetic resistance sensor (not shown) is disposed below the first track 61. A current is supplied through the third conductive wire E3 formed on the right end of the first track 61 and the first conductive wire E1 formed on the left end of the second track 63. The magnetic domain of the second track 63 is moved toward the right side of the first track 61. A resistance value of the magnetic resistance sensor varies according to the magnetization direction of the moving magnetic domains. The magnetic resistance sensor disposed below the first track 61 can read a magnetized direction by measuring the resistance value. The position of the magnetic resistance sensor can be determined as required.

The present invention includes the following advantages.

First, when operating a memory device, unlike in an HDD, the memory device is not mechanically or physically moved or contacted, and allows the recording and reading of data. Therefore, mechanical wear does not occur, so that the device is appropriate for application in mobile devices. Also, due to its ability to be miniaturized, the memory device may be made into a high-density device capable of storing data in a density of terabits/in$^2$.

Second, the structure of the memory device is substantially simplified, so that the device is advantageous for mass production and reproducibility.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, the semiconductor device according to the present invention may be a storage device such as an HDD further including a read/write head, a memory device such as a RAM further including a read/write electrode, and a logic device. Therefore, the scope of the invention is defined not by the detailed description of the invention but by the appended claims, and all differences within the scope will be construed as being included in the present invention.

What is claimed is:

1. A memory device comprising:
    a first track layer formed in a first direction and including a magnetic material;
    an interconnecting layer formed on the first track layer; and
    a second track layer formed in a second direction on the interconnecting layer and including a magnetic material;
    wherein
        the first track layer and the second track layer each have a part extending from the interconnecting layer, the part being not in contact with the interconnecting layer,
        the interconnecting layer is formed of a magnetic material which has a lower magnetic anisotropy energy constant than that of the first track layer and that of the second track layer, and
    a magnetization direction of at least part of at least one of the first track layer, the second track layer and the interconnecting layer is reoriented.

2. The memory device of claim 1, wherein the part of the first track layer, which is not in contact with the interconnecting layer and the part of the second track layer, which is not in contact with the interconnecting layer are parallel to each other, are orthogonal to each other, or are disposed to cross each other.

3. The memory device of claim 1, wherein the first and second track layers each have a multilayer structure.

4. The memory device of claim 1, wherein the first and second track layers each are formed of a magnetic material having a magnetic anisotropy constant of between $10^5$ J/m$^3$ and $10^7$ J/m$^3$.

5. The memory device of claim 1, wherein the first and second track layers each are formed of a material with a perpendicular magnetic anisotropy.

6. The memory device of claim 1, wherein the first and second track layers each are formed of a material comprising at least one of CoPt and FePt.

7. The memory device of claim 1, wherein the first and second track layers each have a thickness in the range of 1 nm to 100 nm.

8. The memory device of claim 1, wherein the interconnecting layer has a multilayer structure.

9. The memory device of claim 1, wherein the interconnecting layer is formed of a magnetic material having a magnetic anisotropy constant between $10^2$ J/m$^3$ and $10^3$ J/m$^3$.

10. The memory device of claim 1, wherein the interconnecting layer has a thickness in the range of 10 nm to 100 nm.

11. The memory device of claim 1, wherein the interconnecting layer is formed of at least one of NiFe, CoFe, Ni, Fe, Co, and an alloy comprising at least one thereof.

12. The memory device of claim 1, wherein the second track layer is a magnetic track.

13. The memory device of claim 12, wherein the second track layer includes a bi-directionally movable magnetic domain wall.

14. The memory device of claim 1, wherein the first and second track layers are magnetic tracks including bi-directionally movable magnetic domain walls.

15. The memory device of claim 1, wherein the first and second track layers are formed of magnetic materials.

* * * * *